United States Patent [19]

Buck et al.

[11] Patent Number: 4,551,637

[45] Date of Patent: Nov. 5, 1985

[54] ELECTRONIC MONITORING SYSTEM WITH DIRECT-CURRENT POWER SUPPLY

[75] Inventors: Robert Buck, Neukirch; Jean L. Lamarche, Langenargen, both of Fed. Rep. of Germany

[73] Assignee: IFM Electronic GmbH, Essen, Fed. Rep. of Germany

[21] Appl. No.: 487,122

[22] Filed: Apr. 21, 1983

[30] Foreign Application Priority Data

Apr. 21, 1982 [DE] Fed. Rep. of Germany ....... 3214835
Oct. 16, 1982 [DE] Fed. Rep. of Germany ....... 3238396

[51] Int. Cl.$^4$ .............................................. H03K 3/26
[52] U.S. Cl. ...................................... 307/308; 328/5; 340/561
[58] Field of Search ........................... 307/308; 328/5; 367/179–181; 340/551, 561, 562

[56] References Cited

U.S. PATENT DOCUMENTS

| | | | |
|---|---|---|---|
| 3,719,836 | 3/1973 | Possell | 307/308 |
| 3,935,542 | 1/1976 | Buck | 328/5 |
| 4,135,124 | 1/1979 | Buck | 328/5 |
| 4,193,023 | 3/1980 | Buck et al. | 328/5 |

Primary Examiner—Stanley D. Miller
Assistant Examiner—B. P. Davis
Attorney, Agent, or Firm—Karl F. Ross; Herbert Dubno

[57] ABSTRACT

A contactless motion detector is energized in series with a load from a source of direct current via a pair of supply leads connected across a binary switching circuit in parallel with a voltage-generating network designed to deliver operating current to the detector in either switching position. The switching circuit comprises a main electronic switch, designed as a transistor, which is turned on or off by an output signal of the detector and in turn controls an ancillary electronic switch (transistor or thyristor) whose conduction intensifies the load current. When both electronic switches are transistors, they are interconnected in a positive-feedback loop driving them into conduction as soon as the main transistor is turned on; the base current of the ancillary transistor then contributes significantly to the load current while its collector current helps maintain the energization of the detector. The voltage-generating network includes a current limiter as well as a constant-voltage generator, e.g. a Zener diode.

17 Claims, 7 Drawing Figures

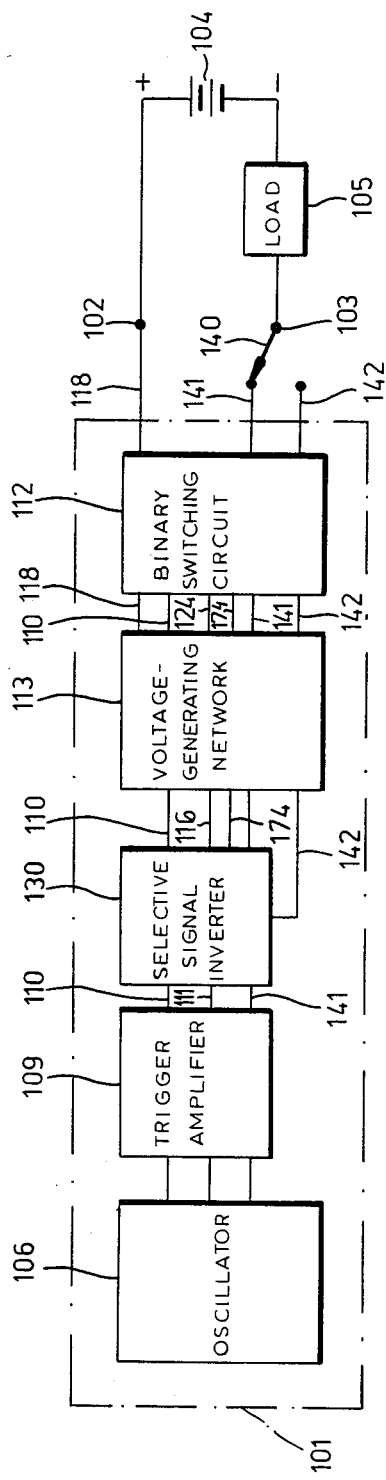
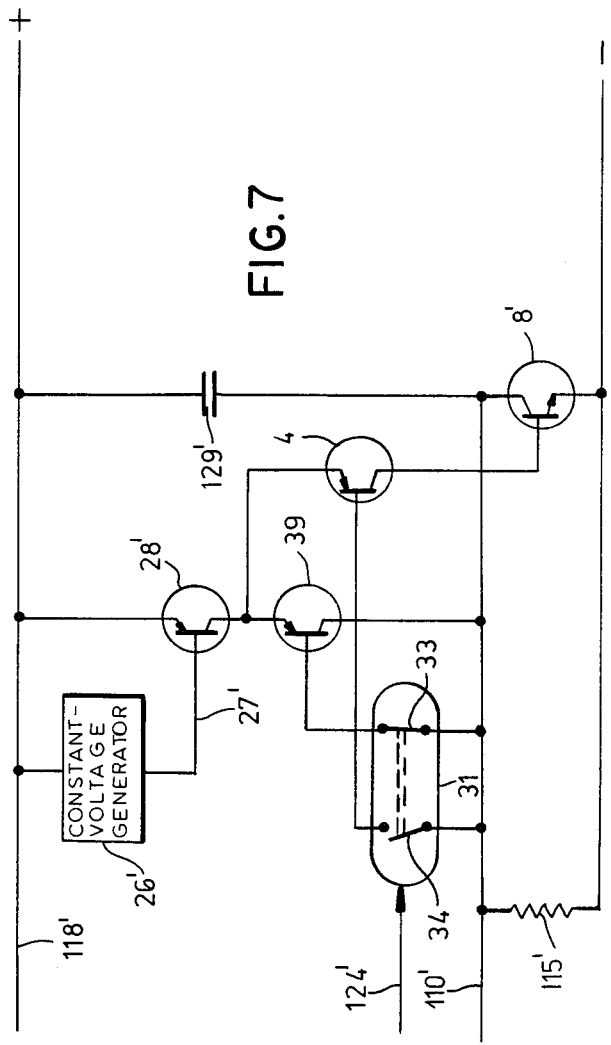

ELECTRONIC MONITORING SYSTEM WITH DIRECT-CURRENT POWER SUPPLY

FIELD OF THE INVENTION

Our present invention relates to an electronic monitoring system, as used for example in a proximity sensor, wherein a preferably contactless detector, sensitive to an ambient condition, generates a binary output signal which alternates between a first and a second value (one of them representing a logical "one", the other a logical "zero") in response to significant changes in that condition, e.g. with the approach and the departure of a metallic element, for the purpose altering the current flow through a load designed to indicate such change.

BACKGROUND OF THE INVENTION

U.S. Pat. No. 4,135,124 in the name of one of us, Robert Buck, discloses a monitoring system of the type here considered which includes logic circuitry for selectively presetting that system to respond to the occurrence of an ambient condition being sensed, i.e. to a change in the value of a binary signal resulting therefrom, with either an intensification or a reduction of the load current. This is accomplished with the aid of an Exclusive-OR (XOR) gate, of the regular or the negated type, which has a first input coupled to the output lead of the detector and a second input provided with switchover means for selectively applying two different voltages to the latter input, either manually or automatically. Depending on the logical value of the applied voltage, the XOR gate transmits either the unmodified binary signal or its logical complement to a control unit of an electronic switch such as a thyristor. Thus, the XOR gate acts as a selective signal inverter whereby, for example, a mechanical relay controlled by the electronic switch can either open or close a load circuit upon the occurrence of the event being monitored.

An improved system of the latter type, with selective signal inversion, is the subject matter of a copending application, U.S. Ser. No. 487,123, filed on even date herewith by two of us, Robert Buck and Jean Luc Lamarche. In one of the embodiments described in that copending application, the energy source in series with the load is a generator of direct current in contradistinction to the alternating-current source used in the systems of the above-identified Buck patent and other patents listed therein.

In these earlier systems, in which the alternating supply voltage is converted into a pulsating unipolar voltage by a fullwave rectifier downstream of the load, a variable-impedance network responsive to a changeover in the output signal of the detector advantageously comprises a thyristor or equivalent electronic device which is switched in a binary mode so as to let the load current vary between two predetermined magnitudes. This is desirable since the output signal of the detector, though itself regarded as of binary character, may in fact assume different values above and below a certain threshold which the load is intended to recognize. The prior thyristor circuits, however, cannot be employed with a d-c supply since a thyristor, once triggered by a positive-going gate voltage, remains conductive until its anode current is cut off. The simple substitution of a transistor for such a thyristor obviates this problem but does not establish a binary mode of operation. Moreover, care must be taken to insure that the detector, e.g. an oscillator working into a trigger amplifier, receives the necessary operating current in both the conductive and the nonconductive state of the electronic switch; when that switch is cut off, the current drawn by the detector must be low enough to prevent a premature tripping of the load (e.g. an electromagnetic relay), whereas conduction of that switch must not deprive the detector of is minimum voltage supply. In earlier monitoring systems utilizing an a-c source, this requirement has been satisfied with the aid of a current limiter, e.g. a constant current unit of the type described in prior U.S. Pat. No. 4,193,023 in the names of Robert Buck and Gerd Marhofer.

OBJECTS OF THE INVENTION

Particularly when the monitoring system is to be suitablefor use with d-c sources of widely varying terminal voltage, the uninterrupted energization of the detector with both high and low load currents presents difficulties which cannot be overcome with the known circuit arrangements. An important object of our present invention, therefore, is to provide a monitoring system of the type discussed above which can be operated with a wide range of supply voltages.

Another object of our invention is to provide a system of this character with electronic switch means, including only transistors or a transistor/thyristor combination, adapted to operate in a binary mode.

SUMMARY OF THE INVENTION

A monitoring system according to our present invention comprises the usual detector means sensitive to an ambient condition, as discussed above, along with a voltage-generating network provided with an incoming lead, an outgoing lead and a common lead, the latter two leads being respectively connected to a pair of power-unit terminals of the detector means. A utilization circuit, including a source of direct current in series with a load, has a supply terminal of one polarity connected to the incoming lead and a supply terminal of the opposite polarity connected to the common lead. A binary switching circuit, connected across the incoming and common leads, includes a main electronic switch with a control electrode coupled to the output lead of the detector and an ancillary electronic switch controlled by the main switch. The ancillary switch has a first electrode connected to the incoming lead, a second electrode connected to the outgoing lead and a third electrode which is connectable to the common lead upon conduction of the main electronic switch in response to a changeover of the output signal of the detector from a first to a second value whereupon both switches become concurrently conductive. The ancillary switch then establishes two flow paths for additional load current, one of them extending via its second electrode to the outgoing lead which energizes the detector; the other flow path extends via the third electrode to the common lead so as to bypass the voltage-generating network, the latter including current-limiting impedance means lying in parallel with the first-mentioned flow path between the incoming and outgoind leads of that network. The common lead could be grounded.

It should be noted that, in light of the foregoing observations, the terms "first value" and "second value" as applied to this signal may each encompass a range of voltages or currents on opposite sides of a predetermined threshold.

In the embodiments particularly described hereinafter, the main electronic switch is a transistor—specifically one of the PNP type—while the ancillary electronic switch is either another transistor or a thyristor. In the latter case, the first, second and third electrodes referred to above are, respectively, the anode, the gate and the cathode of the thyristor; in view of the connections described above, the incoming lead of the voltage-generating network will then be connected to the positive supply terminal while the common lead is connected to the negative supply terminal. When the two electronic switches are a first and a second transistor, the emitter, the collector and the base of the second transistor respectively constitute the first, second and third electrodes of that switch.

In order to establish a binary mode of operation for a switching circuit not including a thyristor or equivalent triggerable device, the first and second transistors are preferably interconnected in a positive-feedback loop establishing the level of conductivitly of both transistors when the output signal of the detector changes to its second value.

The current-limiting impedance means of the voltage-generating network could be a simple resistor but may also be designed as a constant-current unit similar to that described in the above-identified Buck/Marhofer patent.

While the system according to our present invention is entirely compatible with a selective signal inverter according to the concurrently filed application U.S. Ser. No. 487,123, whose disclosure is hereby incorporated by reference into our present application, it will be understood that such a switchover is not essential for the present purpose.

BRIEF DESCRIPTION OF THE DRAWING

The above and other features of our invention will now be described in detail with reference to the accompanying drawing in which:

FIG. 1 is a block diagram of an electronic monitoring system with d-c power supply according to our invention;

FIGS. 4–7 show further modifications of the system of FIG. 2.

SPECIFIC DESCRIPTION

Figure 2:
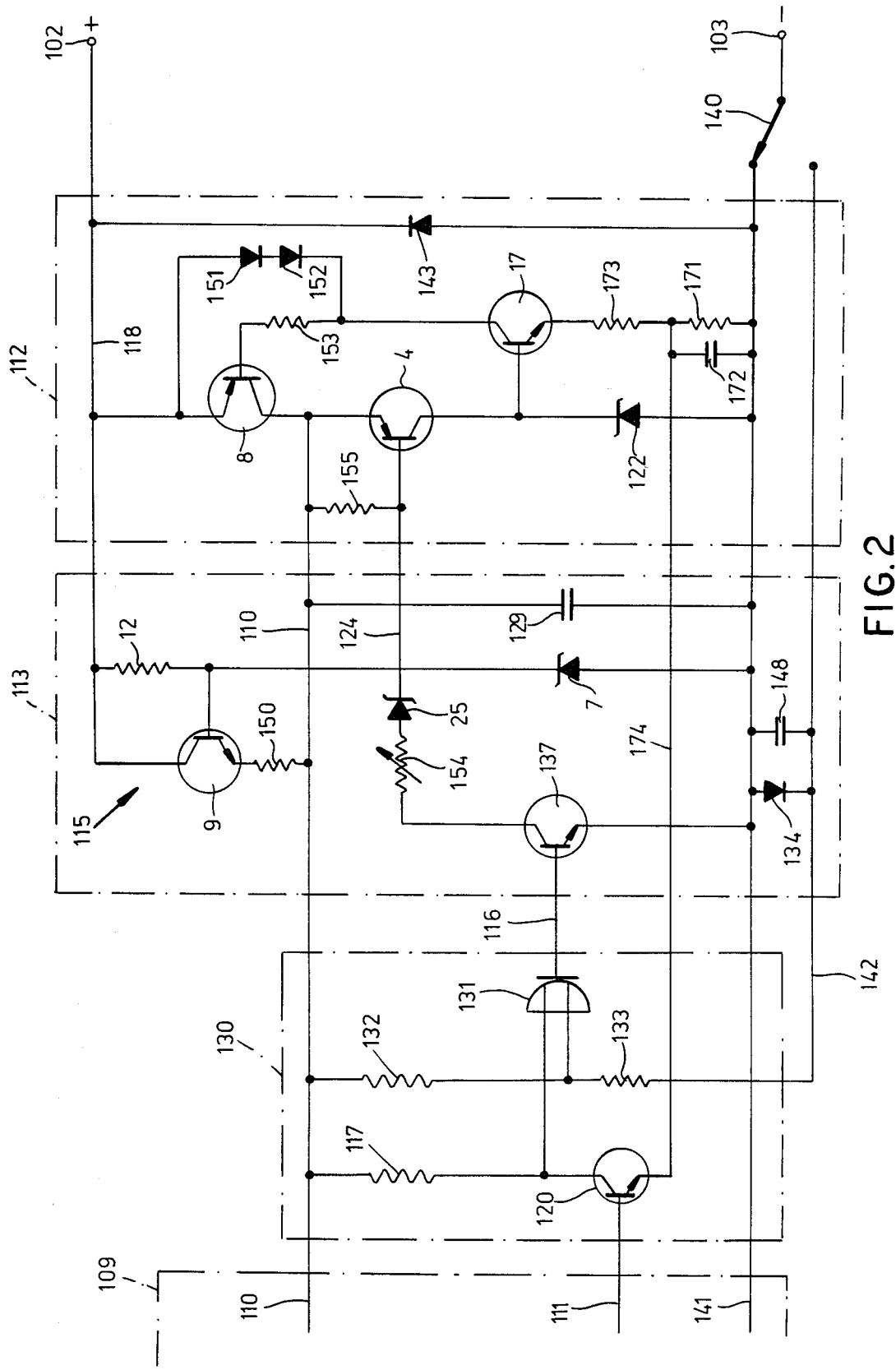
FIG. 2 is a more detailed circuit diagram of certain components of the system of FIG. 1 in accordance with a particular embodiment.

FIG. 1 shows the basic components of a monitoring system 101 embodying our invention, namely an oscillator 106 and a trigger amplifier 109 together constituting a detector, a utilization circuit including a current-responsive load 105 such as a relay in series with a direct-current source 104 shown as a battery, this circuit having a positive supply terminal 102 and a negative supply terminal 103, a voltage-generating network 113 linked with amplifier 109 by way of a selective signal inverter 130, and a binary switching circuit 112 interposed between network 113 and utilization circuit 104, 105. Network 113 has an incoming lead 118, extending from positive supply terminal 102 by way of switching circuit 112, an outgoing lead 110 extending from that network on the one hand to switching circuit 112 and on the other hand via signal inverter 130 to detector 106, 109, and a common lead 141 which traverses all the components of system 101 and is connected to the negative supply terminal 103 by a selector switch 140 in the illustrated position thereof. In an alternative position, switch 140 connects terminal 103 to an ancillary lead 142 which terminates at the inverter 130 to modify the effect of a binary signal appearing on an output lead 111 of amplifier 109. Other connections 116, 124 and 174, linking network 113 with the adjacent components 130 and 112, will be described hereinafter.

Source 104, of course, could be an a-c generator provided with a rectifier upstream of terminal 102, 103. The positions of that source and the load 105 could also be interchanged.

As illustrated in FIG. 2, and in conformity with the disclosure of the concurrently filed application U.S. Ser. No. 487,123 signal inverter 130 includes an Exclusive-OR (XOR) gate 131 with two inputs connected to lead 110 via respective resistors 117 and 132. The first input of XOR gate 131 is further connected to the collector of an NPN transistor 120 whose base is tied to the output lead 111 of amplifier 109 and whose emitter is connected to the aforementioned lead 174 extending between components 112, 113 and 130. The second input of XOR gate 131 is further connected, via a resistor 133, to the ancillary lead 142 which is joined to lead 141 by a diode 134 in parallel with a capacitor 148. With lead 174 connected to negative lead 141 (which may be grounded) by way of an RC network 171, 172, low voltatge on output lead 111 cuts off the transistor 120 whereby, in the illustrated position of switch 140, XOR gate 131 is nonconductive with de-energization of its output lead 116. When the voltage on lead 111 is highly positive, gate 131 conducts and energizes the lead 116. If, however, switch 140 connects terminal 103 to ancillary lead 142, the situation is reversed so that lead 116 is energized in the presence of low voltage on lead 111 and is de-energized when that voltage is high.

In the subsequent description it will be assumed that switch 140 is in its illustrated position, or that XOR gate 131 is omitted along with transistor 120, so that the voltage on lead 116 varies directly with that on lead 111.

Lead 116 terminates within network 113 at the base of an NPN transistor 137 whose emitter is tied to common lead 141 while its collector is connected by away of an adjustable resistor 154 and a Zener diode 25 to the lead 124 which extends within switching circuit 112 to the base of a PNP transistor 4 constituting a main electronic switch. Transistor 4 has its emitter connected to the outgoing lead 110 of network 113 while its collector is connected by way of another Zener diode 122 to the common lead 141. Leads 110 and 124 are bridged by a resistor 155 which thus interconnects the base and emitter of transistor 4. A PNP transistor 8, constituting an ancillary electronic switch, has its collector tied to lead 110 and its emitterconnected to incoming lead 118 serving as a positive bus. A stack of diodes, only two of which have been illustrated at 151 and 152, connects the emitter of transistor 8 to its base by way of a resistor 153 and is further connected to the collector of an NPN transistor 17 whose base is tied to the collector of transistor 4 and whose emitter is connected to the lead 141, serving as a negative bus, via a voltage divider including a resistor 173 in series with the aforementioned resistor 171. The two buses 118 and 141 are interconnected by a reverse-poled diode 143.

Network 113 further includes a current limiter 115 which generally conforms to a similar device 15 shown in the aforementioned U.S. Pat. No. 4,193,023 to Buck and Marhofer. Thus, current limiter 115 comprises an NPN transistor 9 with its collector tied to positive bus 118, its emitter connected via a resistor 150 to outgoing lead 110, and its base connected to a junction of a resistor 12 with a Zener diode 7 serially inserted between leads 118 and 141.

In operation, low voltage on the output lead 111 of amplifier 109 (indicating, for example, the absence of an object being monitored) cuts off transistors 137, 4, 8 and 17. Transistor 9, however, is traversed by a constant current of a magnitude depending on the supply voltage, the threshold potential of Zener diode 7 and the values of resistors 12 and 150. The last three parameters are so chosen that oscillator 106 and amplifier 109 (FIG. 1) are properly energized even if the supply voltage varies within a rather wide range, e.g. between 80 and 120 V. The current drawn under these conditions, however, must not be so large as to actuate the load 105 in series with source 104.

If, now, the voltage on lead 111 changes to a high value, e.g. as a result of an approach of the monitored object, transistor 137 becomes conductive and generates a voltage drop across resistor 155. Transistor 4 is thus also turned on and causes the conduction of transistor 17 in cascade therewith whereby transistor 8 likewise becomes active. This tends to drive the lead 110 more positive, yet the resulting voltage rise on that lead is minimized by negative feedback due to the increased conductivity of transistor 4 and the decreased conductivity of transistor 9. The additional negative feedback created by resistors 171 and 173 stabilizes the conduction of transistor 17 and, with it, that the transistor 8; part of the feedback, it may be noted, also limits the conduction of transistor 120 in signal inverter 130.

As will be apparent, the load current circulating on leads 118 and 141 passes in part to lead 110 by way of transistors 8 and 9, thereby maintaining the energization of detector stages 108 and 109, and partly bypasses the detector by flowing from the positive supply lead 118 via the emitter/collector path of transistor 8 as well as via the emitter/base path of that transistor to the negative supply lead 141 through main and further transistors 4 and 17. A portion of this current also traverses the diode stack 151-152, thus avoiding the transistor 8; it is possible, however, to omit these diodes along with resistor 153 so as to connect the base of transistor 8 directly to the collector of transistor 17 which is then traversed only by the base current of transistor 8. Zener diode 122 could also be eliminated, with the collector current of transistor 4 flowing only through the base/emitter path of transistor 17; compare FIG. 4 discussed hereinafter. In any of these cases, the supplemental current drawn through the load in this mode of operation is sufficiently limited to prevent a short-circuiting of the detector.

With or without circuit elements 51-53, the three transistors 4, 8 and 17 of component 112 are interconnected by a positive-feedback loop which, together with the aforedescribed negative feedback, establishes a binary mode of operation for this component. It is worth noting that, at least in the simplified case lacking elements 122 and 151-153, the major part of the load current traversing the transistor 8 will pass to lead 141 via the base of this transistor while only a minor part will flow through its collector whence some of it will reach the detector via lead 110 while the remainder will pass through the emitter/collector path of transistor 4 and the base/emitter path of transistor 17.

Figure 3:
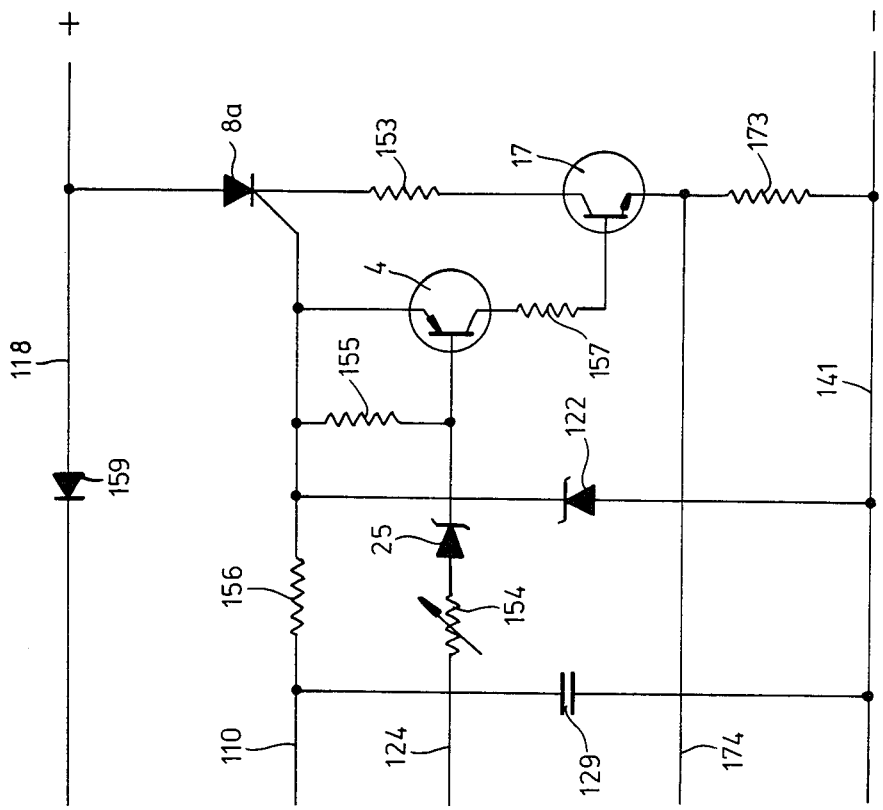
FIG. 3 is a diagram showing a partial modification of the circuitry of FIG. 2, pursuant to another embodiment.

In FIG. 3 we have shown a modification of circuit 112 in which the ancillary electronic switch is constituted by a thyristor 8a whose gate is connected to lead 110 by way of a resistor 156 and also to lead 141 through Zener diode 122. The anode of thyristor 8a is tied to lead 118 while its cathode is connected to the collector of transistor 17 through resistor 153. A further resistor 157 is shown inserted between the collector of main transistor 4 and the base of auxiliary transistor 17 whose emitter resistance in this instance is reduced to the resistor 173; it will be apparent, however, that the combination of impedances 171-173 could also be used in the embodiment of FIG. 3 which otherwise conforms to that of FIG. 2, aside from the insertion of a diode 159 in lead 118 downstream of its junction with the anode of thyristor 8a.

In operation, as in the preceding embodiment, transistors 4 and 17 are cut off as long as the output voltage of the detector is low. When that voltage assumes its alternate high value, transistor 4 is turned on as before and activates the transistor 17 which thereby conductively links the negative lead 141 with the cathode of thyristor 8a whose gate is held at a relatively positive potential by the current limiter 115 (FIG. 2); that potential is stored, as in the preceding embodiment, on capacitor 129. The conduction of transistor 17 thus causes a brief partial discharge of capacitor 129 through resistor 156 and the gate/cathode gap of thyristor 8a which thereupon fires and draws a supplemental load current passing to a major extent through transistor 17 via its cathode and to a minor extent onto lead 110 via its gate. The conduction of transistors 4 and 17 is again sufficiently limited to maintain the operation of the detector, with diode 159 preventing a momentary short-circuiting of the current limiter during ignition of the thyristor.

Figure 4:
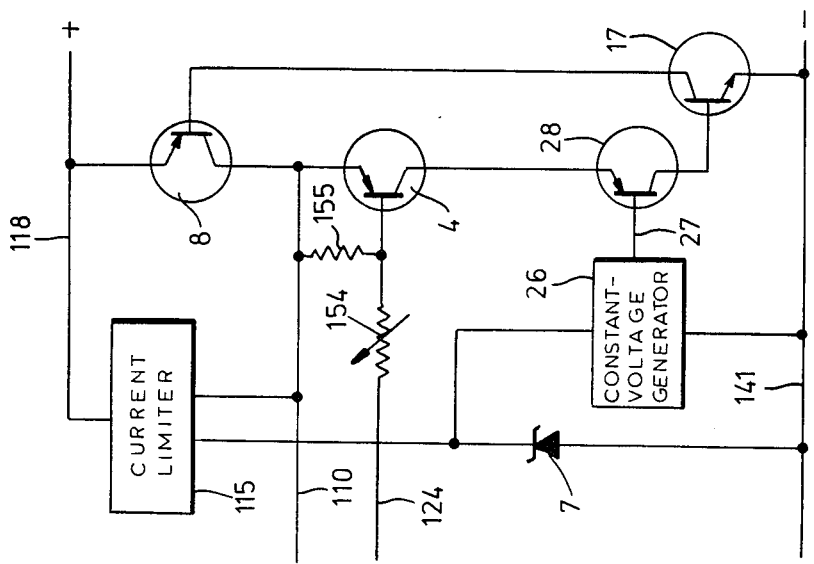

FIG. 4 illustrates a partial modification of the circuitry of FIG. 2 in which, aside from the omission of elements 122 and 151-153, another PNP transistor 28 is inserted in series with transistor 4 between the collector of the latter and the base of transistor 17. The base of this fourth transistor 28 is biased positive, with reference to lead 141, by an output lead 27 of a constant-voltage generator 26 connected across Zener diode 7. Generator 26, which may be a simple voltage divider possibly including another Zener diode, allows limited conduction of transistor 28 when lead 124 goes negative upon conduction of transistor 137 (FIG. 2) so as to turn on the transistor 4 under the conditions described above. Transistor 28 thus acts as another current limiter and reduces the need for other limiting circuit elements such as Zener diode 25 or feedback resistor 173 which therefore have been omitted in FIG. 4; they could, however, be included if desired. It will also be evident that transistor 8 could be replaced in FIG. 4 by a thyristor such as that shown at 8a in FIG. 3.

Transistor 28, while shown to form part of the group included in the switching circuit 112 (FIG. 2), may be incorporated along with generator 26 and components 106, 109 and 130 in a separate integrated module.

Figure 5:
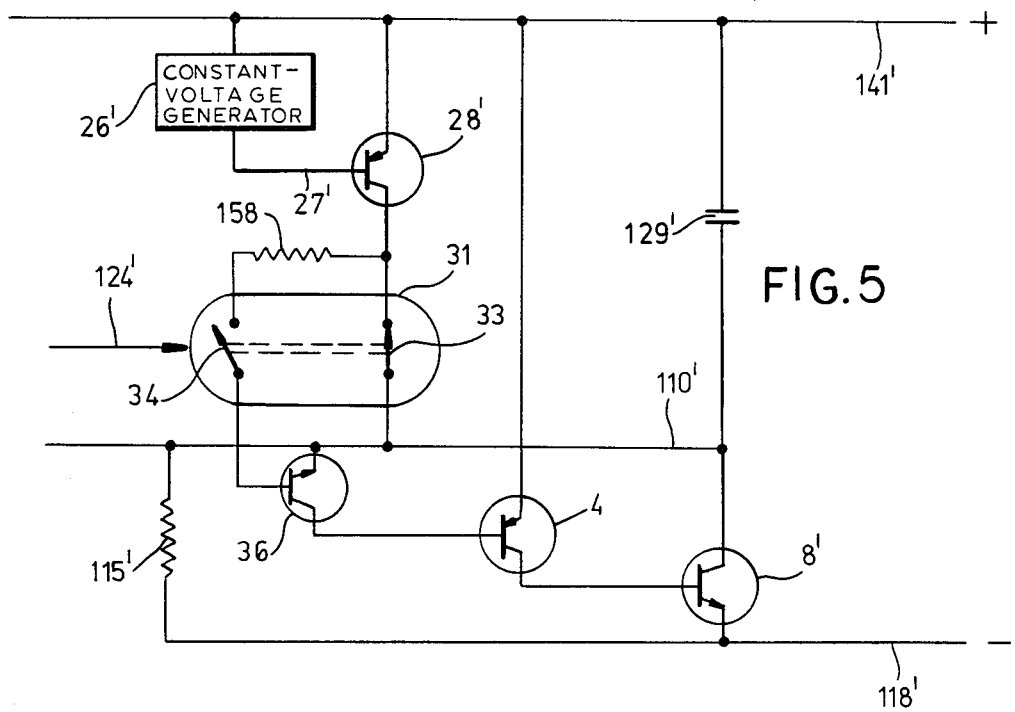
Figure 6:
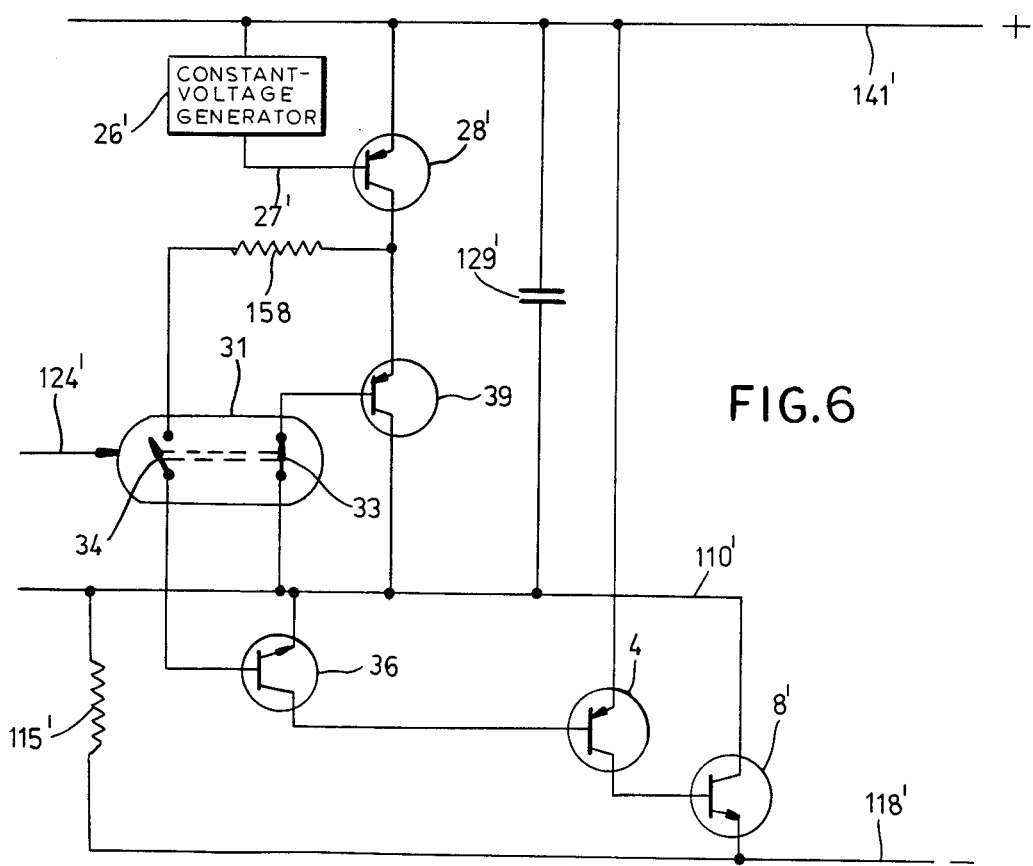

Reference will now be made to FIGS. 5-7 which represent an inversion of the circuit arrangement of the preceding Figures in that an incoming lead 118' and a common lead 141', which may again be grounded, are respectively connected to the negative and the positive supply terminal. In each of these three Figures, the main electronic switch is still a PNP transistor 4 while the ancillary electronic switch is an NPN transistor 8'; a current limiter 115'—here shown as a simple resistor—connects the incoming lead 118' to an outgoing lead 110'. An additional PNP transistor 28' has its emitter connected to positive supply lead 141' and receives a somewhat less positive base potential from an output lead 27' of a constant-voltage generator 26' also connected to that supply lead. At 31 we have diagrammatically indicated a control unit including a pair of electronic switches 33, 34 which are controlled in an antivalent mode by voltage on a lead 124' dependent, as in the case of lead 124 of FIGS. 2–4, on the output signal of the associated detector. With switch 33 closed and switch 34 open, as shown, that output signal is of such character (e.g. low) that the load is not activated; when it changes to its alternate value, the positions of switches 33 and 34 are reversed. These two switches, of course, could also be transistors. In all instances, furthermore, transistor 8' has its emitter tied to lead 118', its collector tied to lead 110' and its base connected to the collector of transistor 4. Furthermore, a capacitor 129' is inserted between leads 141' and 110' to maintain the requisite voltage on the latter lead during a switchover of control unit 31.

In the illustrated switch position of FIG. 5 the collector of transistor 28' is connected via switch 33 to lead 110' while a branch of its collector lead, including a negative-feedback resistor 158, is disconnected by switch 34 from the base of a further NPN transistor 36 whose emitter is tied to lead 110' and whose collector is joined to the base of transistor 4; the emitter of the latter transistor is directly connected to lead 141'. The three tandem-connected transistors 36, 4 and 8' are therefore all cut off while a reduced load current, sufficient to operate the associated detector, passes from lead 141' via transistor 28', switch 33 and current-limiting resistor 115' to lead 118'. When the position of switches 33 and 34 is reversed by a voltage change on lead 124', transistor 28' conducts via resistor 158, switch 34, the base/emitter path of transistor 36 and limiting resistor 115' whereby the cascaded transistors 36, 4 and 8' are turned on, causing the flow of a supplemental load current via transistor 4 and the base/emitter path of transistor 8'. The portion of the load current flowing through transistor 28', resistor 158 and the base/emitter path of transistor 36 maintains the energization of lead 110', with some of that portion traversing the collector of transistor 8'. An increase in the collector current of this transistor therefore augments the voltage drop across feedback resistor 158 so as to tend to lessen the conductivity of transistor 36, thereby counteracting the positive feedback from transistor 8' to transistor 36 via lead 110' so as to stabilize the current flow.

The circuitry of FIG. 6 differs from that of FIG. 5 by the presence of yet another PNP transistor 39 with its emitter tied to the collector of transistor 28', its collector joined to lead 110' and its base connected to the same lead in the illustrated closure position of switch 33. With transistor 39 conducting in that illustrated position but cut off in the alternate switch position, the operation is essentially the same as in the previous instance. In each case, therefore, unit 31 establishes in the illustrated position a connection independent of transistor 36 between leads 110' and 141' while in the alternate switch position that connection includes the base/emitter path of that transistor along with resistor 158.

In FIG. 7, which again shows the transistor 39 in series with transistor 28', the emitter of main transistor 4 is tied to the emitter/collector junction of these two series transistors while its base is connectable to lead 110' in the closed position of switch 34. The resistor 158 of FIGS. 5 and 6 has been omitted. The restriction of the current flow through the cascaded transistors 4 and 8', in the alternate switch position of unit 31, is here accomplished by the limited conductivity of transistor 28' determined by voltage generator 26'. The conduction of transistor 39 in the illustrated position establishes a low-impedance path between the emitter/collector junction of transistors 28' and 4; in the alternate switch position the base of transistor 4 is connected to lead 110' by way of switch 34 in a low-impedance path similar to that formed in the corresponding position of FIGS. 5 and 6 by the conducting transistor 36.

We claim:
1. An electronic monitoring system comprising;
detector means sensitive to an ambient condition for generating on an output lead a binary signal alternating between a first and second value in response to significant changes in said ambient condition, said detector means being provided with a pair of power-input terminals;
a voltage-generating network provided with an incoming lead, an outgoing lead and a common lead, said outgoing and common leads being respectively connected to said power-input terminals;
a utilization circuit including a source of direct current in series with a load, said utilization circuit having a supply terminal of one polarity connected to said incoming lead and a supply terminal of the opposite polarity connected to said common lead; and
a binary switching circuit connected across said incoming and common leads, said switching circuit including a main electronic switch and an ancillary electronic switch, said main electronic switch having a control electrode coupled to said output lead, said ancillary electronic switch having a first electrode connected to said incoming lead, a second electrode connected to said outgoing lead and a third electrode connectable to said common lead under the control of said main electronic switch upon conduction thereof in response to a changeover of the output signal of said detector means from said first value to said second value thereof, said ancillary electronic switch becoming conductive concurrently with said main electronic switch in the presence of said second value for establishing two flow paths for additional load current, one of said flow paths extending via said second electrode to said outgoing lead, the other of said flow paths extending via said third electrode to said common lead, said voltage-generating network including current-limiting impedance means lying in parallel with said one of said flow paths between said incoming and outgoing leads.

2. A system as defined in claim 1 wherein said main electronic switch is a transistor with a base constituting said control electrode.

3. A system as defined in claim 2 wherein said ancillary electronic switch is a thyristor with an anode constituting said second electrode and a cathode constituting said third electrode, said incoming and common leads being respectively connected to a positive supply terminal and to a negative supply terminal of said utilization circuit.

4. A system as defined in claim 3 wherein said transistor further has an emitter connected to said outgoing lead and a collector connected to base of a further transistor with an emitter and a collector inserted in said other of said flow paths.

5. A system as defined in claim 3, further comprising a Zener diode inserted between said outgoing and common leads.

6. A system as defined in claim 2, further comprising a storage capacitor inserted between said outgoing and common leads.

7. A system as defined in claim 1 wherein said main electronic switch is a first transistor with a base constituting said control electrode, said ancillary electronic switch being a second transistor with an emitter constituting said first electrode, a collector constituting said second electrode and a base constituting said third electrode.

8. A system as defined in claim 7, further comprising a third transistor inserted between said common lead and the base of said second transistor, said third transistor having a base connected to the collector of said first transistor.

9. A system as defined in claim 8 wherein the connection between the base of said third transistor and the collector of said first transistor includes a fourth transistor with a base/emitter path connected across a constant-voltage generator.

10. A system as defined in claim 7 wherein said first transistor has an emitter/collector path inserted between said common lead and the base of said second transistor.

11. A system as defined in claim 10 wherein the coupling between said output lead and the base of said first transistor includes switch means responsive to said output signal for establishing a low-impedance connection between the last-mentioned base and said outgoing lead in the presence of said second value of said output signal.

12. A system as defined in claim 11 wherein said switch means includes a further transistor.

13. A system as defined in claim 12 wherein said switch means establishes between said common and outgoing leads a first connection independent of said further transistor in the presence of said first value of said output signal and a second connection including a base/emitter path of said further transistor in the presence of said second value of said output signal.

14. A system as defined in claim 13 wherein said first and second connections both include an emitter/collector path of an additional transistor having a base/emitter path connected across a constant-voltage generator.

15. A system as defined in claim 11 wherein the emitter/collector path of said first transistor lies in series with an emitter/collector path of an additional transistor having a base/emitter path connected across a constant-voltage generator.

16. A system as defined in claim 15 said switch means establishes a low-impedance connection between said outgoing lead and a junction of said emitter/collector paths in the presence of said first value of said output signal.

17. A system as defined in claim 7 wherein said first and second transistors are interconnected in a positive-feedback loop.

* * * * *